(12) United States Patent
Drimer et al.

(10) Patent No.: US 7,408,381 B1
(45) Date of Patent: Aug. 5, 2008

(54) CIRCUIT FOR AND METHOD OF IMPLEMENTING A PLURALITY OF CIRCUITS ON A PROGRAMMABLE LOGIC DEVICE

(75) Inventors: Saar Drimer, Cambridge (GB); Jason J. Moore, Albuquerque, NM (US); Austin H. Lesea, Los Gatos, CA (US)

(73) Assignee: XILINX, Inc., San Jose, CA (US)

( * ) Notice: Subject to any disclaimer, the term of this patent is extended or adjusted under 35 U.S.C. 154(b) by 145 days.

(21) Appl. No.: 11/353,748

(22) Filed: Feb. 14, 2006

(51) Int. Cl.
*H03K 19/177* (2006.01)
*H01L 25/00* (2006.01)
*G06F 12/14* (2006.01)

(52) U.S. Cl. .............................. 326/41; 326/38; 326/47; 713/189

(58) Field of Classification Search .................. 326/38, 326/39, 40, 41, 47; 713/189
See application file for complete search history.

(56) References Cited

U.S. PATENT DOCUMENTS

2005/0283566 A1* 12/2005 Callaghan .................... 711/104

OTHER PUBLICATIONS

Xilinx, Inc.; U.S. Appl. No. 11/353,740 by Lesea filed Feb. 14, 2006.

* cited by examiner

*Primary Examiner*—Daniel D Chang
(74) *Attorney, Agent, or Firm*—John J. King (57) ABSTRACT

A circuit for implementing a plurality of circuits on a programmable logic device, the circuit comprising a first circuit implemented on a first portion of the programmable logic device; a second circuit implemented on a second portion of the programmable logic device; and a control circuit coupled to the first circuit and the second circuit, the control circuit providing isolation between the first circuit and the second circuit. While the first circuit and the second circuit may comprise redundant circuits implementing a common function, the circuits may also comprise circuits which must be isolated, such as an encryption circuit and a decryption circuit implementing a cryptographic function. A method for implementing a plurality of circuits on a programmable logic device is also disclosed.

20 Claims, 5 Drawing Sheets

CIRCUIT FOR AND METHOD OF IMPLEMENTING A PLURALITY OF CIRCUITS ON A PROGRAMMABLE LOGIC DEVICE

FIELD OF THE INVENTION

The present invention relates generally to programmable logic devices, and in particular, to a circuit for and method of implementing a plurality of circuits on a programmable logic device.

BACKGROUND OF THE INVENTION

Certain applications of electronic systems, such as military, aerospace, and high-reliability communications, require certain safeguards to ensure the integrity of the applications. One way to promote integrity of an application is to provide redundancy to ensure that the data for the application is correctly processed and retained. In the event of a failure of one circuit, the data of the redundant circuit may be used. Also, the detection of errors may also be required in these applications, even if the likelihood of such an occurrence is extremely low, in order to provide high accuracy. Furthermore, applications running in redundant systems require fast detection and correction of an error in order to minimize the impact upon the operation. Even a rare single event upset (SEU) must be detected so that appropriate system measures may be taken to ensure a very high uptime of the circuit. In certain circumstances, automatic correction of errors may also provide a significant advantage. For example, when processing real-time data, automatic correction of errors allows the operation of the circuit to continue without the need for a system reset. When employing a programmable logic device, error correction allows much faster system recovery time because the device does not need to be completely reconfigured, which may require many seconds of system downtime.

In other applications of electronic systems, the integrity of a system is maintained by providing separate integrated circuits for portions of the system. For example, in an encryption system, non-encrypted signals, often called red signal, must be isolated from a circuit providing access to encrypted signals, often called black signals. That is, careful segregation of signals is required in cryptographic systems that contain sensitive or classified plaintext information (i.e. red signals) and encrypted information, or ciphertext (i.e. black signals).

One class of integrated circuits which may be used to implement circuits requiring the integrity of data to be maintained is a programmable logic device (PLD). A PLD is designed to be user-programmable so that users may implement logic designs of their choices. Programmable logic circuits of a PLD comprise gates which are configurable by a user of the circuit to implement a circuit design of the user. One type of PLD is the Complex Programmable Logic Device (CPLD), which comprises two or more "function blocks" connected together and to input/output (I/O) resources by an interconnect switch matrix. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose.

A PLD comprises circuit elements formed in a substrate and a plurality of metal layers coupling the circuit elements. The metal layers may comprise metal layers for connecting elements of a functional block, while other layers are used for connecting the various functional blocks. For example, the first five layers may comprise local routing conductors used for connecting circuit elements of the various functional blocks, such as memory elements or CLBs of a programmable logic device, while the upper six layers may comprise the interconnect circuits (i.e. conductors for connecting the various functional blocks). The even layers of the interconnect circuits may be used to route signals in a longitudinal direction, while the odd layers may be used to route signals in a lateral direction. The length of a conductor of the interconnect circuits may be defined by the number of conductor segments coupled between a pair of programmable interconnect points (PIPs) which enable local routing. Relatively short conductors (e.g. "double lines" comprising two segments between PIPs) may be included in a first pair of horizontal and vertical metal layers. Similarly, "hex lines" comprising six segments coupled between PIPs may be formed on another pair of horizontal and vertical metal layers. Finally, long conductors may be formed on another pair of horizontal and vertical metal layers. The long conductors may extend between the edges of the integrated circuit, for example. Alternatively, in larger programmable logic devices having a large number of columns, such as 150 columns, for example, long lines may extend a smaller number of columns, such as 32 columns.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM), either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block. At the end of this start-up phase, the PLD is now specialized to the user's design, and the PLD enters into "user" mode as part of its normal operation.

In order for the PLD to function properly, it is necessary that the data loaded into a memory is not corrupted. Data in a PLD may be corrupted for a variety of reasons. For example, there may be a latent defect in the device. The device may also be affected by a single event upset (SEU), such as a cosmic ray striking a storage element of the device. Finally, the device may be subjected to an adversarial attack, such as an attack by a third party attempting to intercept data. For example, an unauthorized third party may attempt to access decrypted data in a data encryption system. However, because of the nature of the interconnect circuits of a programmable logic device, a single conventional programmable logic device does not provide adequate isolation for circuits requiring data integrity, such as redundant circuits or circuits requiring strict isolation such as encryption circuits.

Accordingly, there is a need for an improved circuit for and method of implementing a plurality of circuits on a programmable logic device.

SUMMARY OF THE INVENTION

A circuit for implementing a plurality of circuits on a programmable logic device is disclosed. The circuit comprises a first circuit implemented on a first portion of the programmable logic device; a second circuit implemented on a second portion of the programmable logic device; and a control circuit coupled to the first circuit and the second circuit, the control circuit providing isolation between the first circuit and the second circuit. The circuit may further comprise a barrier, such as a column of circuits, between the first circuit and the second circuit. The circuit may further comprise a plurality of interconnect lines extending across the barrier, wherein control circuit detects unauthorized signals being transferred between the first circuit and the second circuit. While the first circuit and the second circuit may comprise redundant circuits implementing a common function, the circuits may also comprise circuits which must be isolated, such as an encryption circuit and a decryption circuit implementing a cryptographic function.

According to an alternate embodiment, a circuit for implementing a plurality of circuits on a programmable logic device comprises a first portion of programmable logic having a first function; a second portion of programmable logic having a second function; a barrier between the first portion and the second portion; and a control circuit monitoring communication between the first portion and the second portion across the barrier. The circuit may further comprise a plurality of interconnect lines between the first portion and the second portion of the programmable logic device. The circuit may further comprise an error detection circuit coupled to the first portion and the second portion. For example, the error detection circuit may detect a breach in communication between the first portion and the second portion by continuously reading back configuration data of the programmable logic device.

A method of implementing a plurality of circuits on a programmable logic device is also disclosed. The method comprises the steps of providing a first circuit implementing a first function and a second circuit implementing a second function; providing isolation between the first circuit and the second circuit; independently operating the first circuit and the second circuit; and detecting a breach in communication between the first circuit and the second circuit. The step of providing isolation between the first circuit and the second circuit may comprise a step of selectively connecting the first circuit and the second circuit. Similarly, the step of detecting a breach may comprise a step of detecting a signal incorrectly coupled to, routed on, or read from a interconnect line extending between the first circuit and the second circuit.

DETAILED DESCRIPTION OF THE DRAWINGS

Figure 1:
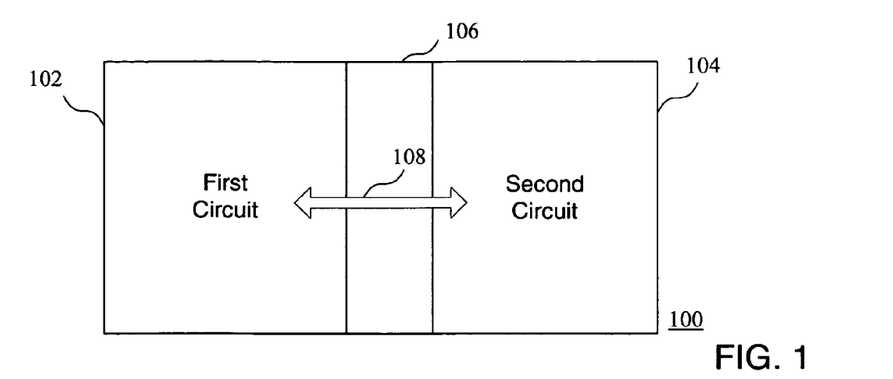
FIG. 1 is a block diagram of a programmable logic device having a plurality of circuits according to an embodiment the present invention.

Turning first to FIG. 1, a block diagram of a programmable logic device 100 having a plurality of circuits according to an embodiment the present invention is shown. As shown in FIG. 1, a first circuit 102 implemented in a first portion of the programmable logic device is isolated from a second circuit 104 implemented in a second portion of the programmable logic device by a barrier 106. According to one embodiment, the only common signal received by the first and second circuits is a power signal. While barrier 106 may provide complete isolation, restricted communication may be provided by a communication channel 108. As will be described in more detail below, the circuit of FIG. 1 enables implementing separate domains in a programmable logic device by providing a verifiable barrier. The separate domain systems reside in a single device and perform predetermined functions, which may be the same function or different functions. For example, the first and second circuits may be redundant circuits performing the same function. In systems requiring communication between the first and second circuits, the circuits preferably communicate through a single dedicated channel.

Figure 2:
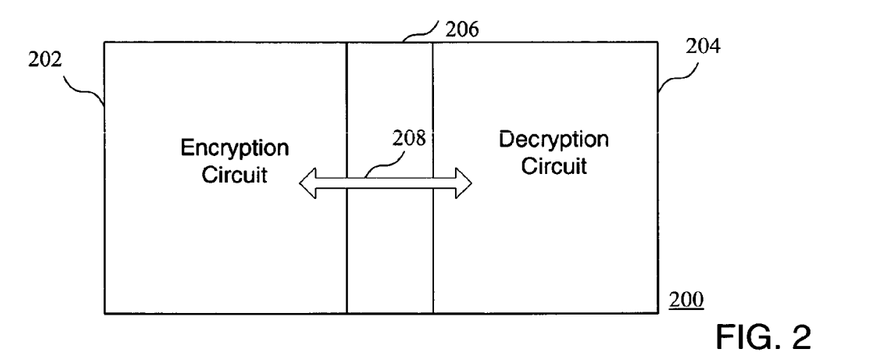
FIG. 2 is a block diagram of a programmable logic device having a plurality of circuits according to an alternate embodiment of the present invention.

However, to maintain the integrity of the system, information may not be transferred from one domain to another by way of any other channel, as will be described in more detail below. In the multiple domain system 100 of FIG. 1, the first circuit 102 may perform a certain security class processing while the second circuit 102 performs another security class processing. The barrier 106 prevents any transfer of signals between the first and second circuits, except as may be provided by the communication channel 108 which is configured to enable authorized communication between the circuits. Any other connection would be considered a breach. As shown in FIG. 2, a block diagram of a programmable logic device has an encryption circuit 202 and a decryption circuit 204 separated by a barrier 206. The barrier 206 also prevents any transfer of signals between the encryption and decryption circuits, except for authorized communications by way of a communication channel 208.

Figure 3:
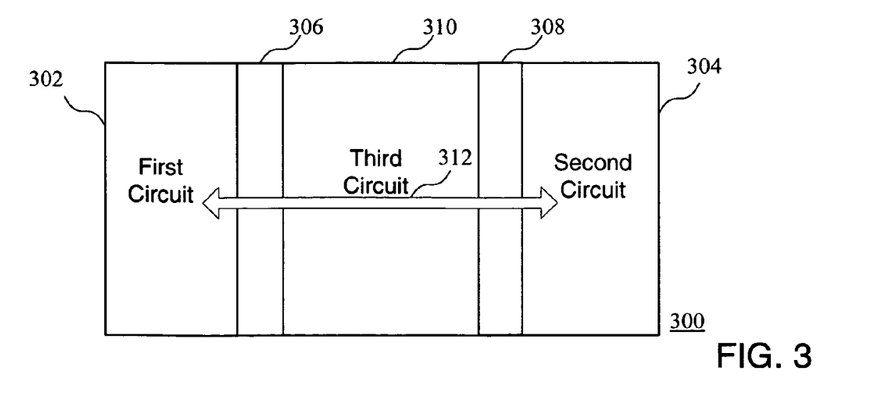
FIG. 3 is a block diagram of a programmable logic device having a plurality of circuits and multiple barriers according to an alternate embodiment of the present invention.

While the barriers are shown having a certain width, such as comprising a column of tiles of a programmable logic device as will be described in more detail below in reference to FIG. 6, the barrier may extend from a plurality of columns, thereby eliminating the chance that certain shorter lines may span the first circuit to the second circuit. Alternatively, multiple barriers may be used to either create a larger separation between the two circuits, or provide isolation between more than two circuits. For example, as shown in FIG. 3, a first circuit 302 and a second circuit 304 are separated by a pair of barriers 306 and 308. A third circuit 310 may be positioned between the pair of barriers. Communication between the first and the second circuit may be restricted to data on a communication channel 312. Because the first and second circuits are separated by a greater distance created by two barriers and the third circuit in between, some or all of the interconnect circuits would not be able to extend from the first circuit to the second circuit. Further, the barriers may also provide isolation between the each of the first and second circuits and the third circuit. While three circuits are shown, isolation may be provided between any number of circuits, as will be described in more detail below.

Figure 4:
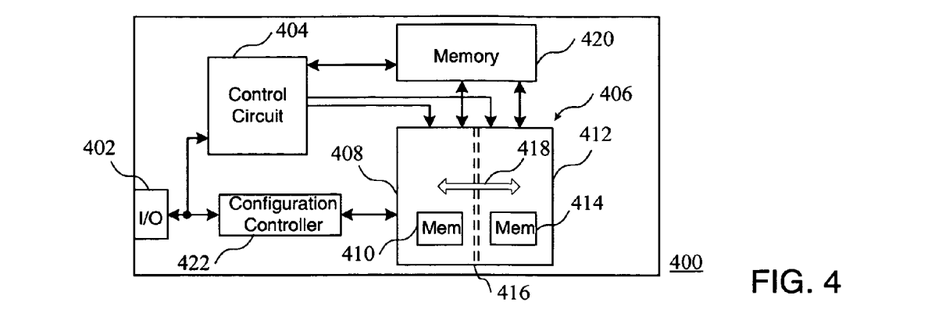
FIG. 4 is a block diagram of a circuit for implementing a plurality of circuits on a programmable logic device according to an embodiment of the present invention.

Turning now to FIG. 4, a block diagram of a circuit for implementing a plurality of circuits on a programmable logic device according to an embodiment of the present invention is shown. The circuit of FIG. 4 comprises an integrated circuit 400 having an input/output port 402 coupled to a control circuit 404 and a programmable logic circuit 406. The programmable logic circuit comprises gates which are configurable by a user of the circuit to implement a circuit design of the user and may be implemented as shown for example in FIGS. 1-3. The circuits implemented in the programmable logic circuit are implemented according to configuration data downloaded to the integrated circuit 400. The programmable logic circuit 406 comprises a first portion 408 having a configuration memory 410 and a second portion 412 having a configuration memory 414. The first and second portions may be separated by a barrier 416, where authorized communication is enabled by a communication channel 418. Although a single programmable logic circuit 406 is shown, it should be understood that the programmable logic circuit 406 may comprise a plurality of programmable logic circuits implemented for example in separate CLBs, which are described in more detail in reference to FIG. 5. Similarly, although a single configuration memory 410 is shown, each portion of the programmable logic circuit may comprise a plurality of memory blocks having memory cells for configuring the portion of the programmable logic device. Also, configuration memory 408 may be either volatile memory or non-volatile memory, or a programmable logic circuit may include both volatile and non-volatile memory. Finally, the circuit may comprise a memory 420, external to the programmable logic circuit, which may either be volatile or non-volatile memory. The circuit of FIG. 4 may be any device having programmable logic, such as a programmable logic device described above, or any integrated circuit having programmable logic, such as an application-specific integrated circuit (ASIC) having a portion of circuits which is programmable. According to one aspect of the embodiment of FIG. 4, the configuration controller 422 enables providing redundancy of circuits or isolation between circuits, as described above with respect to FIGS. 1-3. The operation of the configuration controller will be described in more detail below.

Figure 5:
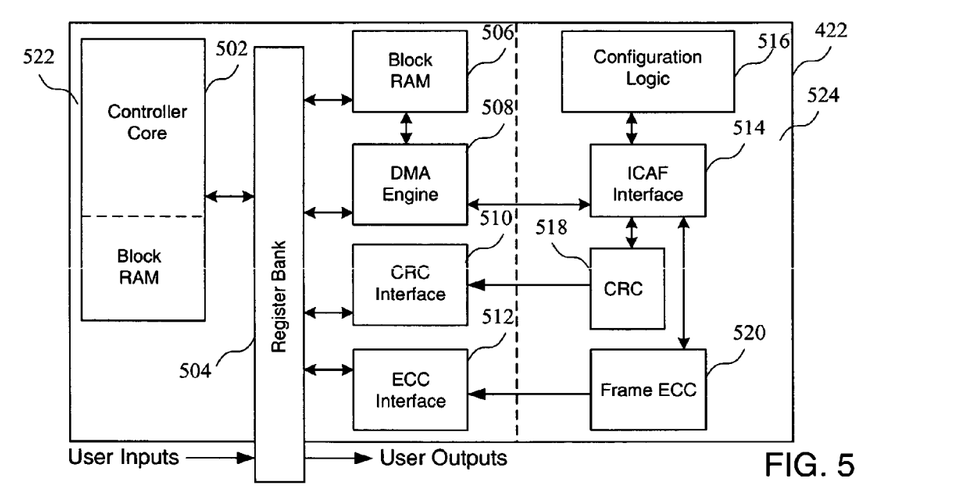
FIG. 5 is a block diagram of a configuration controller enabling the implementation of a plurality of circuits on a programmable logic device according to an embodiment of the present invention.

Turning now to FIG. 5, a block diagram of a configuration controller 422 enabling the implementation of a plurality of circuits on a programmable logic device according to an embodiment of the present invention is shown. In order to ensure that any allowed communication between circuits is provided by an authorized communication channel such as communication channel 418 of FIG. 4, it is necessary to establish that the authorized communication channel is the only communication channel between the circuits. This may be accomplished by a configuration controller having error detection capability, such as frame ECC capability or CRC capability. In various architectures of programmable logic devices, there are interconnect resources, such as local lines, double lines, hex lines, and long lines, which may be used to provide signals between circuits as described above. In order to prevent the unauthorized transfer of a signal from a column, it is not only necessary to detect if an improper connection has been made, but also if an intentional connection to ground has been broken. That is, because a connection to ground provides a means of preventing a long line from spanning the column, any connection to ground which has been improperly broken would indicate an error. Not only does the column in a programmable logic device act as a barrier to prevent any connections to pass through it, it may also act as a means of setting any lines that span the column to a logical '0' so that another connection may not be used in any way to get the information past the barrier, such as a column functioning as a signal barrier. Accordingly, the barrier also serves as a data barrier for double lines, hex lines, and long lines, which may have the ability to skip over a column.

In order to determine whether a breach has occurred, configuration data defining the various connections of the functional blocks of the circuit may be read back and checked against known data to determine whether an error has occurred. Error checking may include both error detection and correction, or error detection without error correction. Because it is necessary to know the location of an error to correct the error, error detection techniques which only indicate the presence of errors (such as the number of errors) but not the location of errors cannot be used alone to correct errors. One conventional technique for detecting and in some cases correcting an error in a frame of data is a single error correction-double error detection ("SECDED") decoding technique. SECDED codes for encoding information, which are also known as "distance-4 Hamming codes," may be used for decoding a string of bits, where error checking or parity bits have been added to a set of data bits. A parity bit is any bit associated with one or more data bits for error checking a transmission of the data bits. Conventionally, parity bits are transmitted with data bits. For SECDED decoding, if any one bit, including data and parity bits, of a transmission is in error, the error may be detected and corrected. If any two bits of a transmission are in error, the error may be detected although it cannot be corrected.

In particular, when data is read back from the memory device, stored parity bits are compared with a newly created set of parity bits from the read data. The result of this comparison, called the syndrome, will indicate the incorrect bit position in a single data error. The syndrome is created upon a memory read and provides the ability to correct single bit errors. SECDED for N bits of data requires K parity bits to be stored with the data where $N \leq 2^K - 1 - K$. If the bits are numbered in sequence, those bit positions that represent powers of two are dedicated to parity bits. One additional parity bit detects double errors that are not correctable. This extra parity bit is an overall parity bit and is comprised by XOR-ing all the data bits and parity bits.

According to another error detection technique called a cyclic redundancy check (CRC), the number of errors even greater than two may be identified. In performing a CRC, a transmitter apends an extra n-bit sequence called a Frame Check Sequence (FCS) to every frame. The FCS holds redundant information about the frame that helps the transmitter detect errors in the frame. However, a CRC provides no indication as to the location of the errors. While the detection of the number of errors provides value in determining whether errors exist, the number of errors alone generally provides little help in correcting errors. A method of correcting errors in a programmable logic device may be found in commonly assigned, concurrently filed U.S. patent application, entitled A METHOD OF CORRECTING ERRORS STORED IN A MEMORY ARRAY by Austin H. Lesea, the entire application of which is incorporated by reference.

The configuration controller 422 shown in FIG. 5 comprises a controller core 502 having a block RAM (BRAM) coupled to a register bank 504. The controller core 502 is used to perform continuous read-back of the device configuration contents of a memory. A separate BRAM 506 is coupled to the register bank 504 and a direct memory access (DMA) engine 508. The register bank is also coupled to a CRC Interface 510 and an ECC interface 512. The DMA engine is coupled to an internal configuration access port (ICAP) interface 514 which interfaces with a configuration logic block 516 to read back data stored in a memory in the configuration logic block. The ICAP interface also provides an interface to a CRC module 518 enabling a CRC of data and a Frame ECC module 520 enabling ECC error detection as will be described in more detail below.

The ICAP interface provides both the read back necessary to read, repair, and write-back the correct data for a frame which was determined to be erroneous. As each frame is read, the configuration controller 422 keeps track of the frame address and stores the frame data using the ICAP interface. In the event of an error, the controller uses the output of the Frame ECC interface to determine whether the error was single-bit or double-bit. In the event of a single-bit error, the syndrome may be used to repair the stored frame. The repaired frame may then be written back through ICAP, effectively correcting the error.

In operation, the control core initiates read-back and monitors the Frame ECC interface for detection and also manages the read modify-write flow required to flip a bit back to its original state when a correction mode is enabled. In maintaining the necessary isolation between the two circuits, it is necessary to read back configuration memory data for interconnects which may enable communication between the two circuits. BRAM is required for the core to control the ICAP interface and store configuration frames for correction. The register bank provides an interface between the configuration controller and the rest of the module. It allows the core to access module inputs and outputs, as well as control the DMA engine 508 that is responsible for managing the flow of configuration data between the block RAM and the ICAP interface. The ICAP interface may be a hard-wired module, as opposed to a module implemented in configurable logic of a programmable logic device, which has direct access to the device configuration logic and supports all the normal configuration operations, such as write, read back, etc. The register bank provides control core access to the CRC interface and the CRC. The register bank also provides control core access to the ECC interface and the Frame ECC core. The circuits may be implemented in portions of the PLD comprising a configurable portion 522 and a hard-wired portion 524, for example.

Data may be read back at a given rate, such as a rate of 68 to 800 complete device scans per second, depending on the size of the device. As each frame of device configuration is read, the CRC or ECC interface is monitored depending upon the methods of detecting errors. The read back of data is preferably continuous. In the event of an error, the controller core provides indication to the user and determines what, if any, action should be taken in response. This allows extremely fast detection of errors anywhere in the configuration address memory even if the errors are going to be corrected. While certain error detection and correction techniques are described, other techniques or circuits may be used to identify a configuration error which may indicate that a breach in communication between two circuits has occurred.

Figure 6:
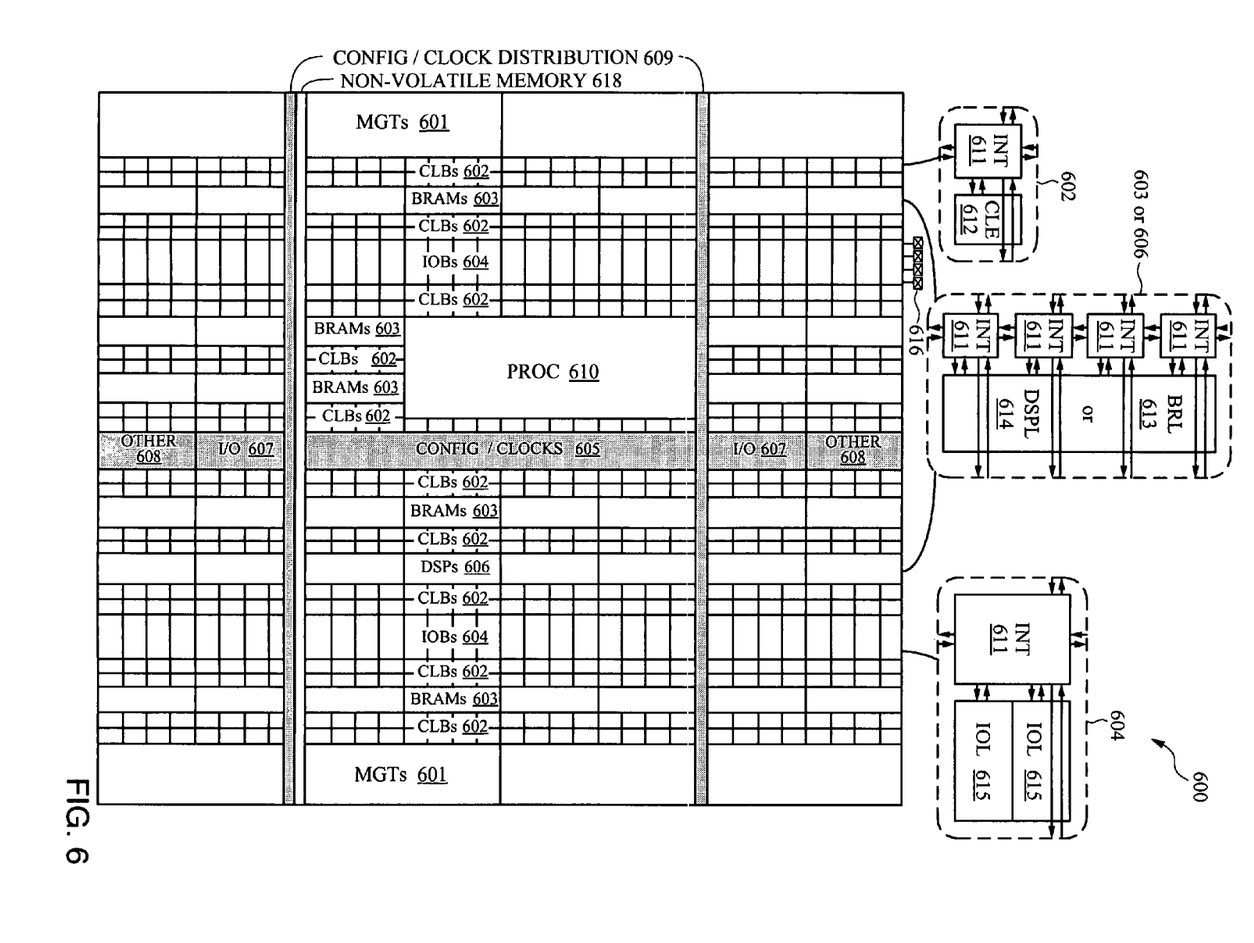
FIG. 6 is a block diagram of a programmable logic device according to an embodiment of the present invention.

Turning now to FIG. 6, a block diagram of a programmable logic device according to an embodiment of the present invention is shown. In an FPGA, for example, the device is divided into configuration columns having programmable tiles or frames. The FPGA architecture 600 of FIG. 6 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610). Depending upon the design of the circuit, a certain number of frames are necessary to load the circuits of a tile.

In some FPGAs, each programmable tile includes a programmable interconnect element (INT 611) having standardized connections to and from a corresponding interconnect element in each adjacent tile. The programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6. Because the columns and frames span the full height of the device, any signal crossing between a barrier tile has to be present in the intermediate frames or may be tapped into. In addition to a column comprising a barrier as described above, the architecture of the FPGA of FIG. 6 lends itself for the creation of a barrier between both vertical and horizontal regions of the FPGA. Accordingly, a continuous read back of the frames of a barrier tile may be employed to determine a domain violation. The frames would be continuously be verified by an error detection code to determine a breach by determining the configuration of the frames of the tile. That is, if a tile is intended to function as a barrier to prevent any data from being transferred across the tile, a breach may be determined by reading back data related to the programmable interconnect elements of the frames of the tile in either direction.

A CLB 602 may include a configurable logic element (CLE 612) that may be programmed to implement user logic plus a single programmable interconnect element (INT 611). A BRAM 603 may include a BRAM logic element (BRL 613) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. The memory 420 of FIG. 4 may be implemented in a BRAM. A DSP tile 606 may include a DSP logic element (DSPL 614) in addition to an appropriate number of programmable interconnect elements. An IOB 604 may include, for example, two instances of an input/output logic element (IOL 615) in addition to one instance of the programmable interconnect element (INT 611). As will be clear to those of skill in the art, the actual I/O pads 616 connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA. Some FPGAs utilizing the architecture illustrated in FIG. 6 include additional logic blocks that disrupt the regular columnar structure making up a large part of the FPGA. The additional logic blocks may be programmable blocks and/or dedicated logic. For example, the processor block PROC 610 shown in FIG. 6 spans several columns of CLBs and BRAMs. Finally, a non-volatile memory 618 may be employed for on-chip storage of configuration data which is used to configure the configuration logic blocks or other programmable tiles as described above.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having configuration memory.

Figure 7:
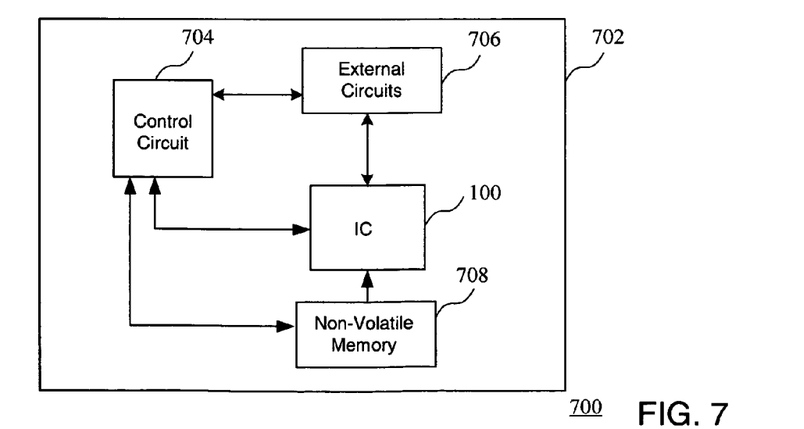
FIG. 7 is a circuit implementing a programmable logic device having a plurality of circuits according to an embodiment of the present invention.

Turning now to FIG. 7, a circuit implementing a programmable logic device enabling implementing a plurality of circuits according to an embodiment of the present invention is shown. The circuit 700 comprises a circuit board 702 having a control circuit 704. The control circuit 704 may be, for example, a microprocessor or other integrated circuit for controlling external circuits 706, integrated circuit 100, and a non-volatile memory 708. Depending upon the type of device employing programmable logic which is used, the control circuit 704 may be implemented on the integrated circuit 100. By allowing users to read back data to determine whether the configuration of a circuit has changed, it is possible to detect that a breach in a programmable logic device of the integrated circuit 100 has occurred as described above. That is, board-level devices external to the integrated circuit 100, such as external circuits 706, may enable the detection of a breach in communication of two circuits of the integrated circuit programmable logic.

Figure 8:
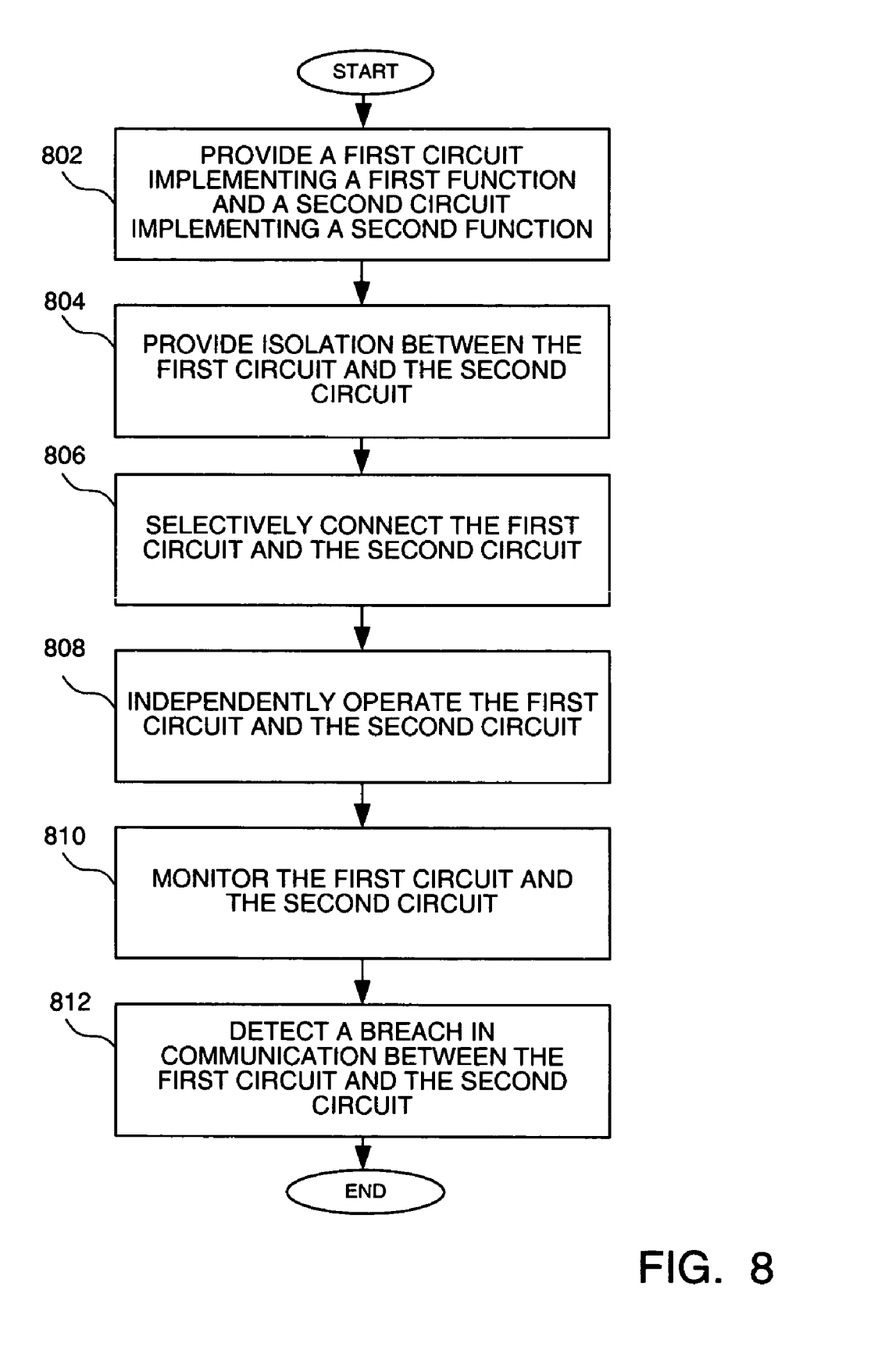
FIG. 8 is a flow chart showing a method of implementing a plurality of circuits on a programmable logic device according to an embodiment of the present invention.

Turning now to FIG. 8, a flow chart shows a method of implementing a plurality of circuits on a programmable logic device according to an embodiment of the present invention. The method of FIG. 8, as well as the method of FIG. 9 described below, may be implemented using the circuits described above in reference to FIGS. 1-7, or other suitable circuits. A first circuit implementing a first function and a second circuit implementing a second function is provided at a step 802. Isolation between the first circuit and the second circuit is provided at a step 804. The isolation may be provided by a barrier, across which unauthorized signals are prevented from being transferred as described above. The first circuit and the second circuit are selectively connected at a step 806. While the first circuit and the second circuit are independently operated at a step 808, the circuits are monitored at a step 810. That is, the configuration of the circuits is monitored to ensure that unauthorized connections are not formed or required connections are not broken. A breach in communication between the first circuit and the second circuit is detected at a step 812 by detecting an unauthorized communication. More details regarding detecting the unauthorized transfer of data is described below in reference to FIG. 9.

Figure 9:
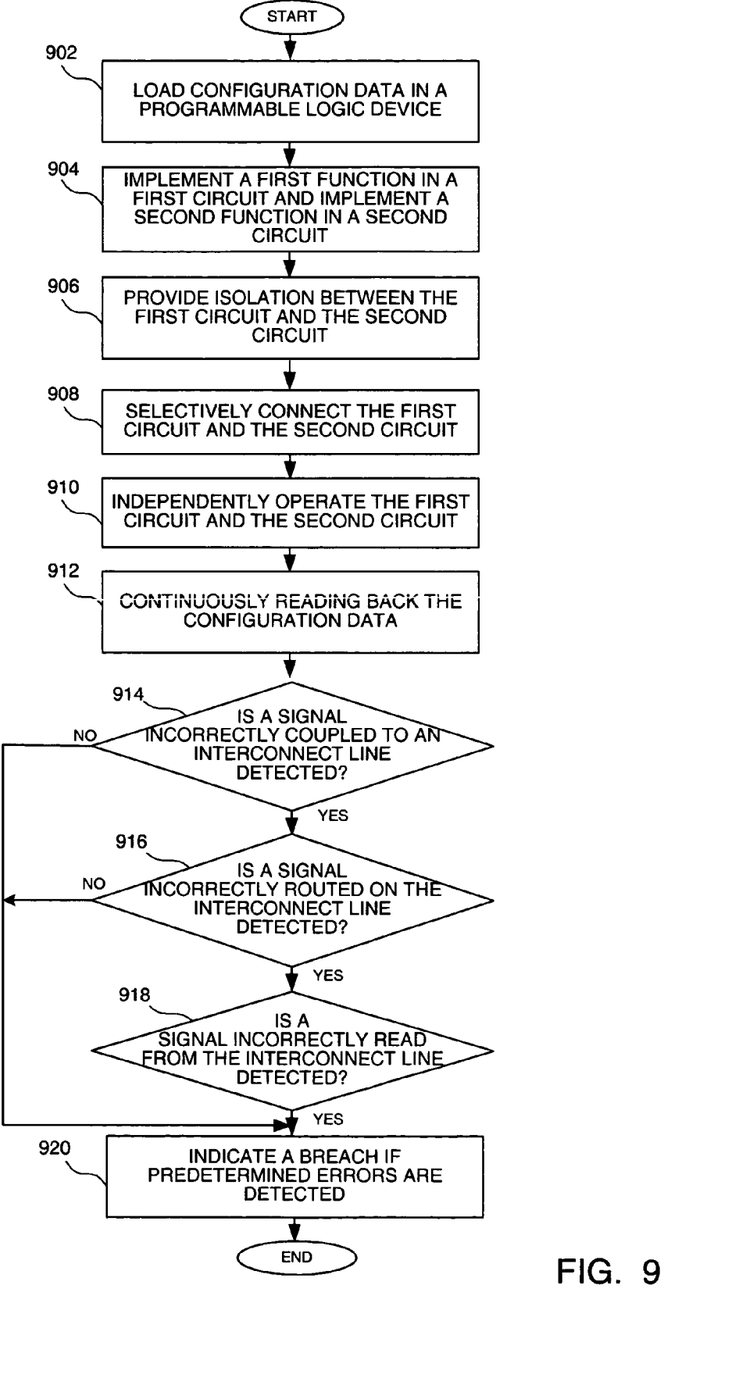
FIG. 9 is a flow chart showing a method of implementing a plurality of circuits on a programmable logic device according to an alternate embodiment of the present invention.

Turning now to FIG. 9, a flow chart shows a method of implementing a plurality of circuits on a programmable logic device according to an alternate embodiment the present invention. Configuration data is loaded in a programmable logic device at a step 902. A first function is implemented in a first circuit and a second function is implemented in a second circuit at a step 904. Isolation is provided between the first circuit and the second circuit at a step 906. The first circuit and the second circuit are selectively connected at a step 908. The first circuit and the second circuit are independently operated at a step 910. The configuration data is continuously read back at a step 912. It is then determined if a signal incorrectly coupled to the interconnect line is detected at a step 914. It is also determined if a signal incorrectly routed on the interconnect line is detected at a step 916. Finally, it is determined if a signal incorrectly read from the interconnect line is detected at a step 918. Signals which are improperly coupled to, routed on, or read from an interconnect line could be detected by a configuration controller, such as a controller core 502 of FIG. 5, based upon the configuration data which would indicate whether an interconnect line is being used or where an interconnect line is connected. A breach is indicated if a predetermined number of steps are breached at a step 920. For example, a breach may be determined if any one of the errors is detected in steps 914-918, or if errors are detected in a certain combination of steps or all of the steps.

It can therefore be appreciated that the new and novel circuit for and method of implementing a plurality of circuits on a programmable logic device has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A circuit for implementing a plurality of circuits on an integrated circuit having programmable logic, said circuit comprising:
    a first circuit implemented on a first portion of said integrated circuit accessible by way of a first interconnect line coupled to said first circuit by a first programmable interconnect element enabling a connection to said first circuit;
    a second circuit implemented on a second portion of said integrated circuit accessible by way of a second interconnect line coupled to said second circuit by a second programmable interconnect element enabling a connection to said second circuit; and
    a control circuit coupled to said first circuit and said second circuit, said control circuit providing isolation between said first circuit and said second circuit by determining whether any unauthorized signals are transferred between said first circuit and said second circuit by way of said connections to said first and second circuits.

2. The circuit of claim 1 further comprising a barrier between said first circuit and said second circuit.

3. The circuit of claim 2 wherein said barrier comprises a column between said first circuit and said second circuit.

4. The circuit of claim 3 further comprising a plurality of interconnect lines extending across said barrier, wherein said control circuit detects unauthorized signals being transferred between said first circuit and said second circuit by way of said interconnect lines.

5. The circuit of claim 1 wherein said first circuit and said second circuit comprise redundant circuits implementing a common function.

6. The circuit of claim 1 wherein said first circuit comprises an encryption circuit and said second circuit comprises a decryption circuit for implementing a cryptographic function.

7. The circuit of claim 1 further comprising a third circuit, said third circuit being isolated from said first circuit and said second circuit.

8. A circuit for implementing a plurality of circuits on an integrated circuit having programmable logic, said circuit comprising:
- a first portion of programmable logic having a first function and accessible by a first interconnect line coupled to said first portion by a first programmable interconnect element;
- a second portion of programmable logic having a second function and accessible by a second interconnect line coupled to said second portion by a second programmable interconnect element;
- a barrier between said first portion and said second portion, said barrier comprising programmable tiles; and
- a control circuit monitoring communication between said first portion and said second portion by way of interconnect lines extending across said barrier and said programmable interconnect elements enabling access to said first portion and said second portion.

9. The circuit of claim 8 wherein said barrier comprises a column between said first portion and said second portion of said programmable logic device.

10. The circuit of claim 8 further comprising a plurality of interconnect lines between said first portion and said second portion of said programmable logic device.

11. The circuit of claim 8 further comprising an error detection circuit coupled to said first portion and said second portion, said error detection circuit detecting a breach in communication between said first portion and said second portion.

12. The circuit of claim 11 wherein said error detection circuit detects a breach in communication between said first portion and said second portion by continuously reading back configuration data of said programmable logic device.

13. The circuit of claim 8 wherein said first portion and said second portion comprise redundant circuits for implementing a single function.

14. The circuit of claim 8 wherein said first portion and said second portion comprise an encryption circuit and a decryption circuit, respectively, for implementing a cryptographic function.

15. A method of implementing a plurality of circuits on an integrated circuit having programmable logic, said method comprising the steps of:
- providing a first circuit implementing a first function and a second circuit implementing a second function;
- providing isolation between said first circuit and said second circuit by way of a programmable interconnect element;
- independently operating said first circuit and said second circuit; and
- detecting a breach in communication between said first circuit and said second circuit by monitoring the configuration bits of said programmable interconnect element.

16. The method of claim 15 wherein said step of providing isolation between said first circuit and said second circuit comprises a step of selectively connecting said first circuit and said second circuit.

17. The method of claim 15 wherein said step of detecting a breach comprises a step of detecting a signal incorrectly coupled to an interconnect line extending between said first circuit and said second circuit.

18. The method of claim 17 wherein said step of detecting a breach comprises a step of detecting a signal incorrectly routed on said interconnect line.

19. The method of claim 18 wherein said step of detecting a breach comprises a step of detecting a signal incorrectly read from said interconnect line.

20. The method of claim 19 further comprising a step of indicating a breach if predetermined steps of detecting a breach are identified.

* * * * *